US008847299B2

(12) United States Patent
Hsu et al.

(10) Patent No.: US 8,847,299 B2
(45) Date of Patent: Sep. 30, 2014

(54) NON-VOLATILE MEMORY AND NON-VOLATILE MEMORY CELL HAVING ASYMMETRICAL DOPED STRUCTURE

(75) Inventors: Tzu-Hsuan Hsu, Hsinchu (TW); Yen-Hao Shih, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 1116 days.

(21) Appl. No.: 12/017,064

(22) Filed: Jan. 21, 2008

(65) Prior Publication Data
US 2008/0128793 A1 Jun. 5, 2008

Related U.S. Application Data

(62) Division of application No. 10/905,194, filed on Dec. 21, 2004, now abandoned.

(51) Int. Cl.
*H01L 29/76* (2006.01)
*H01L 27/115* (2006.01)
*H01L 29/792* (2006.01)

(52) U.S. Cl.
CPC ........ *H01L 27/11568* (2013.01); *H01L 27/115* (2013.01); *H01L 29/792* (2013.01)
USPC .......................................... 257/314; 438/286

(58) Field of Classification Search
USPC .......................................... 257/314; 438/286
See application file for complete search history.

(56) References Cited

U.S. PATENT DOCUMENTS 4,376,947 A * 3/1983 Chiu et al. ..................... 257/316
6,211,011 B1 * 4/2001 Chen ............................. 438/257

FOREIGN PATENT DOCUMENTS

CN          1421917        6/2003

* cited by examiner

*Primary Examiner* — Thanh V Pham
(74) *Attorney, Agent, or Firm* — Jianq Chyun IP Office

(57) ABSTRACT

A non-volatile memory cell comprising a substrate, a charge-trapping layer, a control gate, a first conductive state of source and drain, a lightly doped region and a second conductive state of pocket-doped region. The charge-trapping layer and the control gate are disposed over the substrate. A dielectric layer is disposed between the substrate, the charge-trapping layer and the control gate. The source and drain are disposed in the substrate on each side of the charge-trapping layer. The lightly doped region is disposed on the substrate surface between the source and the charge-trapping layer. The pocket-doped region is disposed within the substrate between the drain and the charge-trapping layer. Because there are asymmetrical configuration and different doped conductive states of implant structures, the programming speed of the memory cell is increased, the neighboring cell disturb issue is prevented, and the area occupation of the bit line selection transistor is reduced.

10 Claims, 3 Drawing Sheets

NON-VOLATILE MEMORY AND NON-VOLATILE MEMORY CELL HAVING ASYMMETRICAL DOPED STRUCTURE

CROSS-REFERENCE TO RELATED APPLICATION

This application is a continuation application of a prior application Ser. No. 10/905,194, filed Dec. 21, 2004, now abandoned. The entirety of the above-mentioned patent application is hereby incorporated by reference herein and made a part of this specification.

BACKGROUND OF THE INVENTION

1. Field of the Invention

The present invention relates to a non-volatile memory device. More particularly, the present invention relates to a non-volatile memory with non-volatile memory cell having asymmetrical doped structure and method of operating the memory cell.

2. Description of the Related Art

Electrically erasable programmable read only memory (EEPROM) is a type of non-volatile memory that allows multiple data writing, reading and erasing operations. The stored data will be retained even after power to the device is removed. With these advantages, EEPROM become one of the most widely adopted non-volatile memories for personal computer and electronic equipment.

A typical EEPROM has a floating gate and a control gate fabricated using doped polysilicon. To program data into the memory, electrons injected into the floating gate are distributed evenly within the polysilicon floating gate layer. Obviously, if there are some defects in the tunneling oxide layer underneath the polysilicon floating gate layer, the device may leak and lead to a drop in reliability.

At present, a type of flash memory cell that programs through hot-hole injection nitride electron storage (PHINES) has been developed as shown in FIG. 1.

FIG. 1 is a schematic cross-sectional view of a conventional programming through hot-hole injection nitride electron storage (PHINES) type flash memory cell. As shown in FIG. 1, the flash memory cell 10 typically comprises a substrate 100, a control gate 120 over the substrate 100, a source 130a and a drain 130b within the substrate 100 and an oxide/nitride/oxide (ONO) layer 110 between the control gate 120 and the substrate 100. The oxide/nitride/oxide (ONO) layer 110 comprises two silicon oxide layers 112 and 116 and a silicon nitride layer 114 sandwiched between them. In general, the silicon nitride layer 114 serves as a charge-trapping layer therein.

The PHINES type flash memory cell in FIG. 1 utilizes band-to-band tunneling hot-hole (BTBTHH) to program data and utilizes the uniform Fowler-Nordheim (FN) channel to erase data.

Although the advantages of PHINES type flash memory cell includes low power consumption, a low leakage current and a simplified manufacturing method, some unavoidable defects are still present. For example, a PHINES type flash memory cell is designed to store a bit of data near the drain region and another bit of data near the source region. However, if the drain region has already stored up a single data bit, the second bit effect is produced when a reverse reading operation is carried out. The second bit effect often leads to a drop in the threshold voltage (Vt) in reverse reading and hence requires a higher bias voltage for reading. Yet, with a high read-out bias voltage, read-out interference will be intensified. Furthermore, the PHINES type flash memory cell has a relatively slow programming speed. In addition, a typical PHINES flash memory cell needs to incorporate three sets of bit line selection transistors (BLT) for programming. Hence, the overhead area for accommodating the bit line selection transistors is large and the actual packing density of the memory cell array is reduced.

SUMMARY OF THE INVENTION

Accordingly, one aspect of the present invention is to provide a non-volatile memory cell capable of increasing the operating speed and preventing neighboring cell disturb issue.

Further aspect of the present invention is to provide a non-volatile memory capable of increasing the operating speed, avoiding undesirable second bit effect and reducing area occupation of bit line selection transistors.

Another aspect of the present invention is to provide a method of operating a non-volatile memory capable of simplifying operation and reducing the number of bit line selection transistors used in the non-volatile memory.

To achieve these and other advantages, as embodied and broadly described herein, the Invention provides a non-volatile memory cell. The non-volatile memory cell comprises a substrate, a charge-trapping layer over the substrate, a control gate over the charge-trapping layer, a first dielectric layer between the substrate and the charge-trapping layer, a second dielectric layer between the control gate and the charge-trapping layer, a first conductive state of source and drain, a first conductive state of lightly doped region and a second conductive state of pocket-doped region. The source and the drain are disposed in the substrate on each side of the charge-trapping layer. The first conductive state lightly doped region is disposed on the substrate surface between the source and the charge-trapping layer. The second conductive type pocket-doped region is disposed in the substrate between the drain and the charge-trapping layer.

According to a first embodiment of the non-volatile memory cell in the present invention, the charge-trapping layer can be a layer fabricated from silicon nitride or a suitable material.

According to a first embodiment of the non-volatile memory cell in the present invention, the first conductive state is N-type and the second conductive state is P-type.

The present invention also provides a non-volatile memory comprising a substrate, a plurality of first conductive state of buried bit lines within the substrate, a plurality of word lines over the substrate and crossing over the buried bit lines, a charge-trapping layer between the word lines and the substrate that between the buried bit lines, a first dielectric layer between the charge-trapping layer and the substrate, a second dielectric layer between the word lines and the charge-trapping layer, a first conductive state of lightly doped region and a second conductive type pocket-doped region. The lightly doped region is disposed on the substrate surface on one side of the buried bit lines. The pocket-doped region is disposed in the substrate on another side of the buried bit lines.

According to a second embodiment of the non-volatile memory in the present invention, the charge-trapping layer can be a layer fabricated from silicon nitride or a suitable material.

According to a second embodiment of the non-volatile memory in the present invention, the first conductive state is N-type and the second conductive state is P-type.

According to a second embodiment of the non-volatile memory in the present invention, the non-volatile memory further comprises two bit line selection transistors connected to the buried bit lines.

The present invention also provides a method of operating a non-volatile memory cell. The non-volatile memory cell comprises a substrate; a first conductive state of first drain, a second drain and a source in the substrate; a word line over the substrate and crossing over the first, the second drain and the source; a charge-trapping layer between the word lines and the substrate that between the first, the second drains and the source; a first dielectric layer between the charge-trapping layer and the substrate; a second dielectric layer between the word lines and the charge-trapping layer; a first conductive state of lightly doped region in the substrate surface on one side of each drain and source; and, a second conductive state of pocket-doped region on the other side of each drain and source. To initiate a programming operation, a first bias voltage is applied to the word line and a second bias voltage is applied to the source, the first drain is connected to a ground and the second drain is set to a floating state. The first bias voltage is lower than the second bias voltage.

The method of operating a non-volatile memory cell according to the present invention further includes an erasing operation. To initiate an erasing operation, a bias voltage for triggering a channel F-N erasing operation is applied to the word line, the first drain and the source are connected to a ground and the second drain is set to a floating state.

The method of operating a non-volatile memory cell according to the present invention further includes a reading operation. To initiate a reading operation, a third bias voltage is applied to the word line, a voltage lower than the third bias voltage is applied to the first drain, the source is connected to a ground and the second drain is set to a floating state.

In the present invention, an implant structure having an asymmetrical configuration and different doped states is applied to a non-volatile memory cell that programs by hot-hole injection nitride electron storage (PHINES). Therefore, programming speed can be increased through increasing the implant dosage while forming the pocket-doped region, and the reading capacity will not be affected. Furthermore, because the lightly doped region in the present invention deploys a low read-out bias voltage, a channel with a higher threshold voltage (Vt) can be used for reading, and the neighboring cell disturb issue is further prevented. In addition, the lightly doped region is able to lower the production of channel hot electrons (CHE) and hence avoids the read-out distribution problem during a reverse reading operation. Moreover, the present invention also disposes of the need to form isolation lines between memory cells so that the programming system and circuits are very much simplified. Additionally, only a single group of bit lines needs to be controlled during a programming operation in the non-volatile memory cell of the present invention so that the area for accommodating the bit line selection transistors can be reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
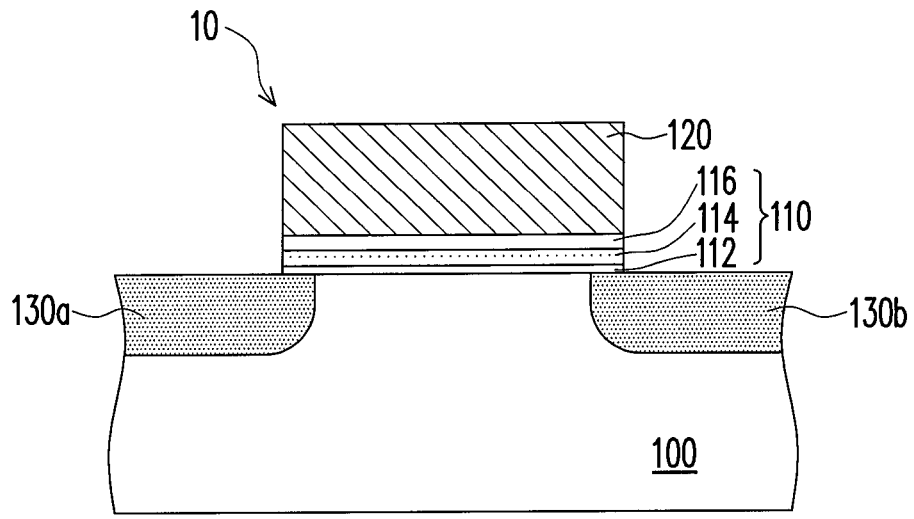
FIG. 1 is a schematic cross-sectional view of a conventional programming through hot-hole injection nitride electron storage (PHINES) type flash memory cell.

Reference will now be made in detail to the present preferred embodiments of the invention, examples of which are illustrated in the accompanying drawings. Wherever possible, the same reference numbers are used in the drawings and the description to refer to the same or like parts.

According to the present invention, a non-volatile memory, a non-volatile memory cell and a method of operating the non-volatile memory cell having a programming by hot-hole injection nitride electron storage (PHINES) is provided.

Figure 2:
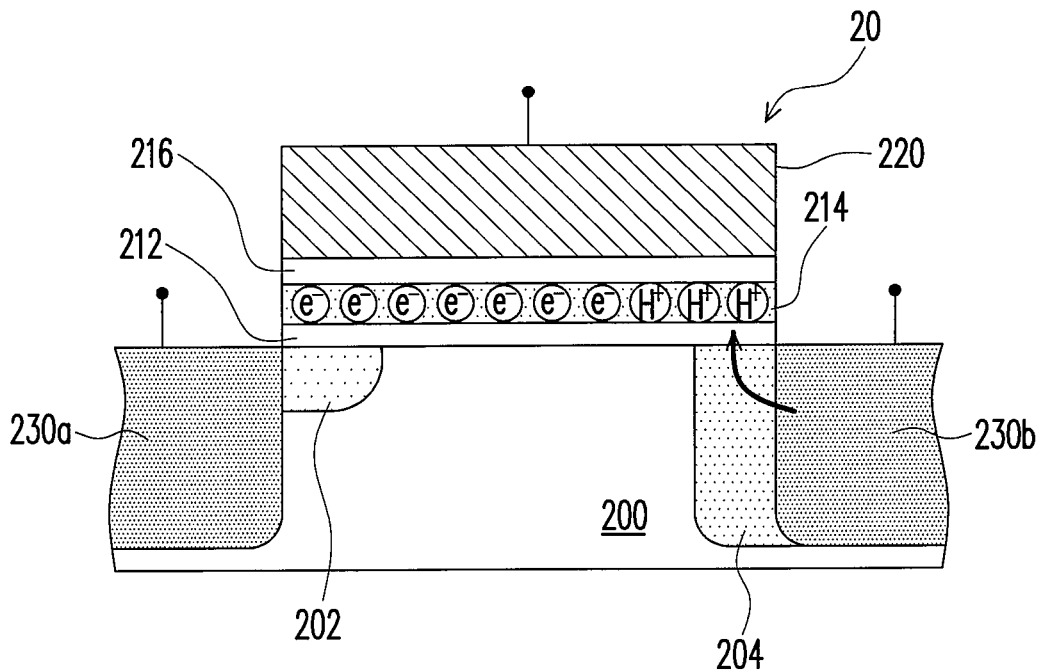
FIG. 2 is a schematic cross-sectional view of a non-volatile memory cell according to a first embodiment of the present invention.

FIG. 2 is a schematic cross-sectional view of a non-volatile memory cell according to a first embodiment of the present invention. As shown in FIG. 2, the non-volatile memory cell 20 of the present invention comprises a substrate 200, a charge-trapping layer 214 on the substrate 200, a control gate 220 over the charge-trapping layer 214, a first dielectric layer 212 between the substrate 200 and the charge-trapping layer 214, a second dielectric layer 216 between the control gate 220 and the charge-trapping layer 214, a first conductive state of source 230a and drain 230b, a first conductive state of lightly doped region 202 and a second conductive state of pocket-doped region 204. In the present invention, the first conductive state is N-type and the second conductive state is P-type, for example. The source 230a and the drain 230b are disposed in the substrate 200 on each side of the charge-trapping layer 214. A channel region (not shown) is formed in the substrate 200 between the source 230a and the drain 230b. The first conductive state of lightly doped region 202 is disposed close to the top surface of the substrate 200 between the source 230a and the charge-trapping layer 214 and the second conductive state of pocket-doped region 204 is disposed in the substrate between the drain 230b and the charge-trapping layer 214. The substrate 200 can be fabricated from a conventional semiconductor material such as silicon. The charge-trapping layer 214 can be fabricated using silicon nitride or other suitable material. Both the first dielectric layer 212 and the second dielectric layer 216 can be fabricated using a single type of material such as silicon oxide or other suitable material or they are fabricated from different types of materials.

The electron and hole distribution profile in the charge-trapping layer 214 when the memory cell 20 is being programmed is shown in FIG. 2. The non-volatile memory 20 in FIG. 2 uses a band-to-band tunneling hot-hole method for a programming operation and a uniform F-N channel for an erasing operation. In addition, the memory cell 20 of the present embodiment can also be used in a multi-bit-per-cell system. In other words, a multiple level threshold voltage can be established on the right side of the non-volatile memory 20 through the band-to-band tunneling hot-hole to obtain more memory states. For example, a 4-level threshold voltage (Vt)

design can be used to produce a memory state having 2-bit per memory cell storage capacity. However, the left side or right side is a type of usage that refers to the disposition relative to a memory cell. This type of language usage can be changed according to the location of the lightly doped region 202 and the pocket-doped region 204 without any effect on the function of the memory cell.

When the memory cell 20 of the present invention operates according to the PHINES method of operation, the drain 230*b* having a pocket-doped region 204 can enhance the programming efficiency of band-to-band tunneling hot-hole so that the programming speed is increased. Furthermore, the source 230*a* having a lightly doped region 202 is able to restrict the production of the band-to-band tunneling hot holes. Therefore, there is no need to settle for a conventional bit constraining method in the non-volatile memory cell of the present invention.

In addition, the non-volatile memory cell of the present embodiment has an asymmetrically doped structure. Hence, the implant dosage of the pocket-doped region 204 can be increased to prevent a punch through of the lightly doped region 202 and increase the programming speed of the memory cell at the same time.

Figure 3A:
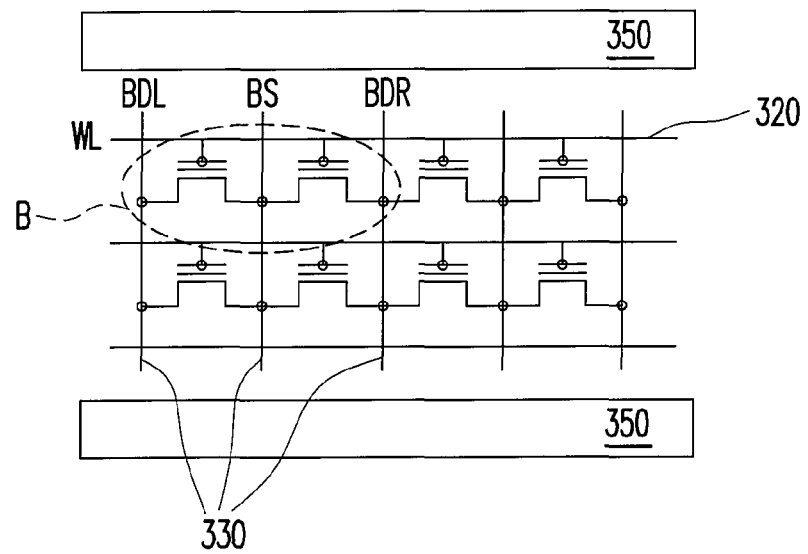
FIG. 3A is an equivalent circuit diagram of a non-volatile memory according a second embodiment of the present invention.
Figure 3B:
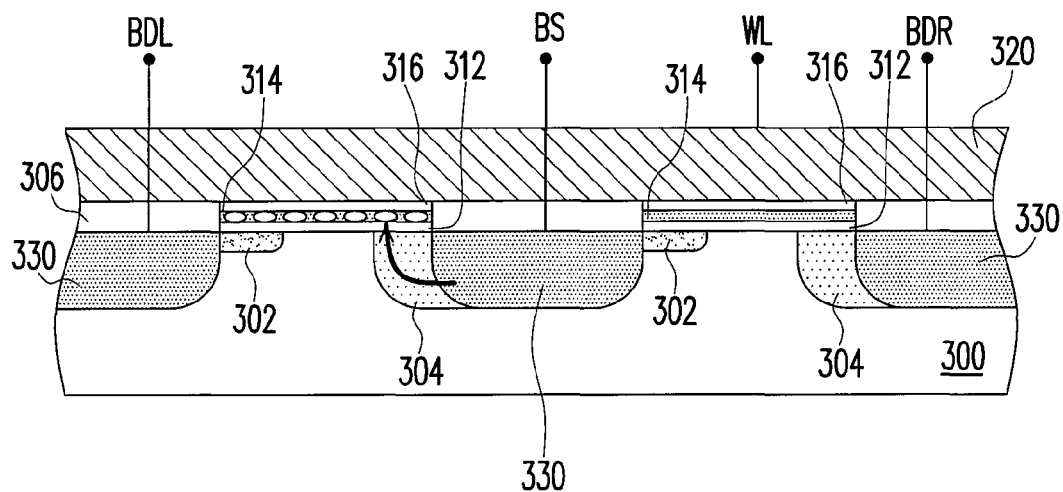
FIG. 3B is a schematic cross-sectional view of the labeled section B of the non-volatile memory in FIG. 3A.
Figure 3C:
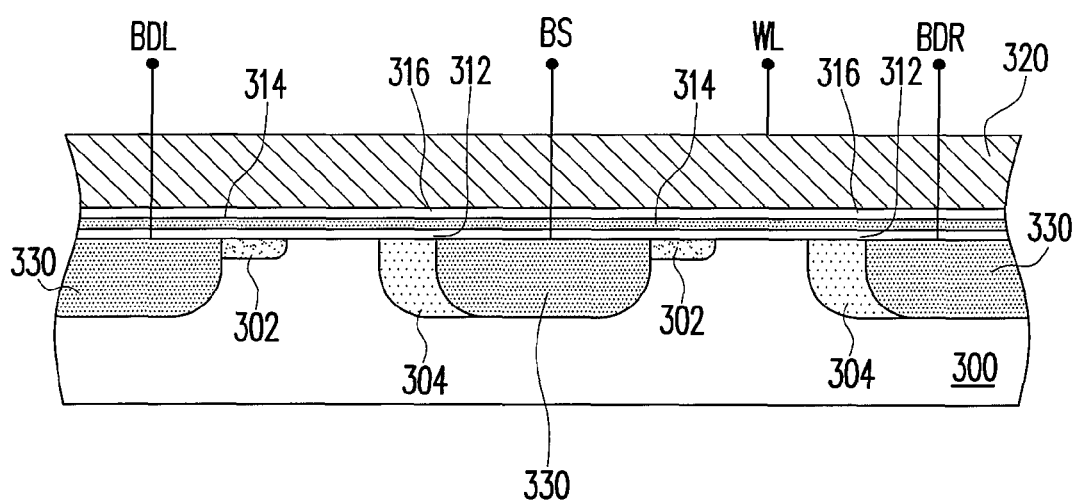
FIG. 3C is another schematic cross-sectional view of the labeled section B of the non-volatile memory in FIG. 3A.

FIG. 3A is an equivalent circuit diagram of a non-volatile memory according a second embodiment of the present invention. FIG. 3B is a schematic cross-sectional view of the labeled section B of the non-volatile memory in FIG. 3A. FIG. 3C is another schematic cross-sectional view of the labeled section B of the non-volatile memory in FIG. 3A. As shown in FIGS. 3A and 3B first, the non-volatile memory mainly comprises a substrate 300, a plurality of first conductive state of buried bit lines 330 in the substrate 300, a plurality of word lines 320 over the substrate 300 and crossing over the buried bit lines 330, a charge-trapping layer 314 between the word lines 320 and the substrate 300 that between the buried bit lines 330, a first dielectric layer 312 between the charge-trapping layer 314 and the substrate 300, a second dielectric layer 316 between the word lines 320 and the charge-trapping layer 314, a first conductive state of lightly doped region 302 and a second conductive state of pocket-doped region 304. The first conductive state is N-type and the second conductive state is P-type, for example. The lightly doped region 302 is disposed near the top surface of the substrate 300 on one side of the buried bit lines 330 while the pocket-doped region 304 is disposed in the substrate 300 on the other side of the buried bit lines 330.

In addition, refer to FIGS. 3B and 3C, a dielectric layer 306 may completely fill the space between the charge-trapping layer 314 and each of the word lines 320 so that they are isolated from each other as shown in FIG. 3B, or the first dielectric layer 312, the charge-trapping layer 314 and the second dielectric layer 316 are extended over the entire substrate 300 as shown in FIG. 3C.

Moreover, in order to operate the memory, two bit line selection transistors 350 are incorporated for electrically connecting with the buried bit lines 330 with the word lines 320.

To initiate a programming operation of the memory cell on the left side of BS (serving as the source of the buried bit line 330), a first bias voltage is applied to WL (the word line 320), a second bias voltage is applied to BS, the line BDL (serving as the first drain of the buried bit line 330) is connected to a ground and the line BDR (serving as the second drain of the buried bit line 330) is set to a floating state. The first bias voltage is lower than the second bias voltage. Meanwhile, the bit line on the right side of BS is constrained because of the floating BDR line and the presence of the n-type lightly doped region 302. It should be noted that the left side or right side is a type of language usage that refers to the disposition relative to a memory cell. This type of language usage can be changed according to the location of the lightly doped region 302 and the pocket-doped region 304 without any effect on the function of the memory.

To erase memory data from the memory cell, a bias voltage capable of triggering an F-N channeling erase operation is applied to the WL line, the BDL and the BS line are connected to a ground and the BDR line is set to a floating state. As a result, electrons are trapped inside the charge-trapping layer 324.

To read data from the memory cell, a reverse reading method can be executed. In the reverse reading operation, a third bias voltage is applied to the WL line, a voltage lower than the third bias voltage is applied to the BDL line, the BS line is connected to a ground and the BDR line is set to a floating state.

In table 1 below, the values of the bias voltage for operating the non-volatile memory are shown. According to table 1, only two bit line selection transistors 350 are required to control a group of word lines WL and a group of bit lines BS in programming the memory of the present embodiment. In addition, a bias voltage smaller than 1.6V applied to the BDL line can be used to carry out a reading operation.

TABLE 1

|  | BDL | BS | BDR | (unit: V) WL |
|---|---|---|---|---|
| FN-erase | 0 | 0 | Floating | −20 |
| HH-program | 0 | 5 | Floating | −5 |
| Read | <1.6 | 0 | Floating | 5 |

In summary, major aspects of the present invention are as follows.

An implant structure having an asymmetrical configuration and different doped states is applied to a non-volatile memory cell that programs by hot-hole injection nitride electron storage (PHINES). Therefore, programming speed can be increased through increasing the implant dosage while forming the pocket-doped region, and the reading capacity will not be affected. Moreover, the lightly doped region utilized in the present invention can prevent the neighboring cell disturb issue caused by programming.

Because the lightly doped region in the present invention deploys a low read-out bias voltage, a channel with a higher threshold voltage (Vt) can be used for reading. In addition, the lightly doped region is able to lower the production of channel hot electrons (CHE) and hence avoids the read-out distribution problem during a reverse reading operation.

The present invention also disposes of the need to form isolation lines between memory cells so that the programming system and circuits are very much simplified.

Only a single group of bit lines needs to be controlled during a programming operation in the non-volatile memory cell of the present invention so that the area for accommodating the bit line selection transistors can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory cell, comprising:
a substrate;

a data storage layer disposed over the substrate;

a control gate disposed over the data storage layer;

a first dielectric layer disposed between the substrate and the data storage layer;

a second dielectric layer disposed between the control gate and the data storage layer;

an N-type source and an N-type drain disposed in the substrate located at each side of the data storage layer;

an N-type lightly doped region disposed in the substrate between the source and the data storage layer; and a P-type pocket-doped region disposed in the substrate between the drain and the data storage layer, wherein the P-type pocket-doped region is the only doped region between the drain and the data storage layer, and a depth of the lightly doped region is shallower than a depth of the pocket-doped region.

2. The memory cell of claim 1, wherein the data storage layer comprises a silicon nitride layer.

3. The memory cell of claim 1, wherein the memory cell also comprises a channel region within the substrate between the source and the drain.

4. The memory cell of claim 1, wherein the data storage is made by injecting hot holes into the data storage layer by band-to-band tunneling hot hole mechanism.

5. A memory, comprising:

a substrate;

a plurality of N-type buried bit lines disposed in the substrate;

a plurality of word lines over the substrate and crossing over the buried bit lines;

a data storage layer disposed between the word lines and the substrate that between the buried bit lines;

a first dielectric layer between the data storage layer and the substrate;

a second dielectric layer between the word lines and the data storage layer;

an N-type lightly doped region disposed close to the top of the substrate located at one side of each of the buried bit lines; and a P-type pocket-doped region disposed in the substrate located at another side of each of the buried bit lines, wherein the P-type pocket-doped region is the only doped region at the another side of each of the buried bit lines, and a depth of the lightly doped region is shallower than a depth of the pocket-doped region.

6. The memory of claim 5, wherein the data storage layer comprises a silicon nitride layer.

7. The memory of claim 5, wherein the memory further comprises a channel region disposed in the substrate between the buried bit lines.

8. The memory of claim 5, wherein the memory further comprises two bit line selection transistors electrically connected to the buried bit lines.

9. The memory of claim 5, wherein the data storage layer comprises a charge-trapping dielectric layer, and the first dielectric layer, the charge-trapping dielectric layer and the second dielectric layer are extended over the entire substrate.

10. The memory of claim 5, wherein the data storage is made by injecting hot holes into the data storage layer by band-to-band tunneling hot hole mechanism.

* * * * *